United States Patent [19]
Hastings

[11] Patent Number: 6,154,076
[45] Date of Patent: Nov. 28, 2000

[54] PHASE ALIGNMENT CIRCUIT FOR PERIODIC SIGNALS

[75] Inventor: Alan Hastings, Allen, Tex.

[73] Assignee: Texas Instruments Incorporated, Dallas, Tex.

[21] Appl. No.: 09/154,058

[22] Filed: Sep. 16, 1998

Related U.S. Application Data

[60] Provisional application No. 60/059,681, Sep. 19, 1997.

[51] Int. Cl.[7] .......................................... H03K 5/04
[52] U.S. Cl. ............................................ 327/175; 327/172
[58] Field of Search ..................... 327/162, 163, 327/165, 166, 172, 175, 176

[56] References Cited

U.S. PATENT DOCUMENTS

| | | | |
|---|---|---|---|
| 5,379,321 | 1/1995 | Girmay | 327/175 |
| 6,023,190 | 2/2000 | Wade | 327/175 |
| 6,028,491 | 2/2000 | Stanchak et al. | 327/175 |

*Primary Examiner*—Kenneth B. Wells
*Attorney, Agent, or Firm*—Wade James Brady, III; Frederick J. Telecky, Jr.

[57] ABSTRACT

A phase alignment circuit which will take a square wave of constant period but indeterminate duty cycle and will transform it into a square wave of equal period and deterministic duty cycle, e.g. 50%. The preferred embodiment alternately charges and discharges two equal capacitors, and passes the resulting ramp voltages through a comparator to produce a square wave output with a 50% duty cycle.

17 Claims, 2 Drawing Sheets

PHASE ALIGNMENT CIRCUIT FOR PERIODIC SIGNALS

This application claims priority under 35 USC § 119(e)(1) of provisional application number 60/059,681 filed Sept. 19, 1997.

BACKGROUND AND SUMMARY OF THE INVENTION

The present invention relates to crystal-stabilized integrated circuit oscillators and more particularly to phase alignment circuits for these oscillators.

Crystal-controlled oscillators use the high Q of an electromechanical resonator (a quartz crystal) to stabilize an oscillating circuit at a desired frequency. Such circuits can achieve a frequency stability in the parts-per-million range, and there is no other practical way to achieve such a constant frequency reference in an integrated circuit. Crystal-controlled oscillators are therefore extremely important, and likely to remain so.

Crystal-controlled oscillators pose some difficulties in design, and one of these is start-up. A variety of startup circuits have been proposed; see e.g. B. Parzen, DESIGN OF CRYSTAL AND OTHER HARMONIC OSCILLATORS (1983), at page 415; Unkrich et al., "Conditions for Start-Up in Crystal Oscillators," 17 *IEEEJ. Solid-State Circuits* 87 (1982).

Other difficulties are present in the specific context of low-power CMOS oscillator implementations. Many portable applications are designed for low operating voltage and low power consumption, but also require the frequency stability of a crystal oscillator. To reduce power consumption, such low-power CMOS oscillator circuits are typically operated in the weak inversion regime (where gate voltages are only slightly greater than the threshold voltage). However, in the weak inversion regime the gain tends to be lower, and thus start-up is a particularly critical problem. See e.g. U.S. Pat. No. 5,546,055, which is hereby incorporated by reference.

Low-power crystal oscillators; such as those used in real-time clock circuits, put out a signal whose duty cycle depends upon a number of different factors, such as threshold voltage, supply voltage, crystal characteristics, parasitics, temperature, etc. A 50% duty cycle can be achieved by passing this signal through a divide-by-2 circuit, but this reduces the frequency to one half that of the crystal.

It is possible to achieve a 50% duty cycle at full frequency by doubling the crystal frequency and then dividing the doubled frequency by two. This solution is not economical; only a few frequencies of crystal are made in sufficient volume to obtain minimum price (e.g. 38.4 kHz, 32.768 kHz), so this option would be too expensive for common usage.

A 50% duty cycle is useful for many applications, particularly in switch-mode power converters. A 50% duty cycle is also desirable for digital circuitry which uses both clock edges.

Innovative Phase Alignment Circuit

The innovative circuit described below uses paired capacitors to take a square wave of constant period but indeterminate duty cycle and to transform it into a square wave of equal period and deterministic duty cycle, e.g. 50%. The preferred embodiment alternately charges and discharges two equal capacitors, and passes the resulting ramp voltages through a comparator to produce a square wave output with a 50% or other predetermined duty cycle.

The innovative circuit can also be controlled to produce virtually any desired duty cycle. The selectable duty cycle allows the innovative circuit to be used for special purpose devices, as well as for charge pumps, converters, specialty clocks, etc. Finally, the innovative circuit can be used as a clock multiplier.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
FIG. 1 shows a block diagram of a crystal oscillator and phase alignment circuit according to the preferred embodiment.
Figure 4:
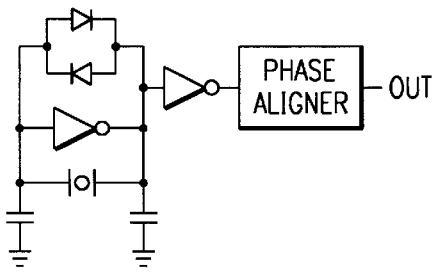
FIG. 4 shows a crystal oscillator circuit connected to a phase alignment circuit according to the preferred embodiment.

The numerous innovative teachings of the present application will be described with particular reference to the presently preferred embodiment (by way of example, and not of limitation), in which:

FIG. 1 shows a block diagram of a crystal oscillator and phase alignment circuit connected in series, according to the preferred embodiment. FIG. 4 shows a typical crystal oscillator circuit connected in series with a phase alignment circuit according to the preferred embodiment.

The innovative circuit uses current-controlled capacitors to phase-align a periodic input signal. Because the voltages generated across the capacitor pair are defined only by the currents used to charge and discharge them, they vary simultaneously with process and temperature variations. The duty cycle produced by the circuit is therefore largely independent of temperature and process variations.

Figure 2:
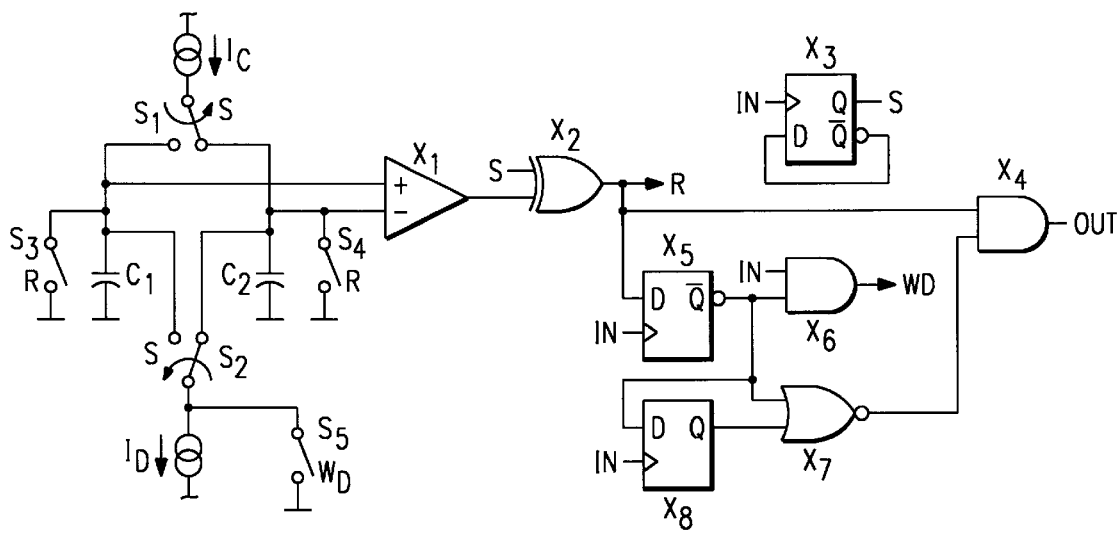
FIG. 2 shows a high-level circuit diagram according to the preferred embodiment.

FIG. 2 shows a high-level diagram of a circuit according to the preferred embodiment. In this figure, the input signal IN, e.g. from a crystal oscillator, is received by flip-flop X3, the noninverting output S of which is used to control switches S1 and S2. S is also used as an input to XOR gate X2.

Current sources IC and ID are used to charge and discharge, respectively, the two capacitors C1 and C2. In a preferred embodiment, IC and ID are equal. C1 and C2 may of course be charged and discharged by individual current sources, but for the sake of simplicity, a single IC and ID are shown to switch between C1 and C2.

Suppose, at time t=0, that IN and S are high. At this time, S1 is connected so that IC charges C2, and S2 is connected so that ID discharges C1. Absent other factors, this state remains for one period of input signal IN. The next time that IN goes high, X3 is triggered and S goes low. At this time, S1 and S2 reverse, so that C1 is charging and C2 is discharging. This process repeats, alternating the charging of C1 and C2, with each period of IN.

Comparator X1 compares the voltages across C1 and C2, and its output is connected to XOR gate X2, along with signal S. The output of X2, signal R, is high when S is high and the voltage across C2 is greater than the voltage across C1. Similarly, R is high when S is low and the voltage across C1 is greater than the voltage across C2.

Figure 5:
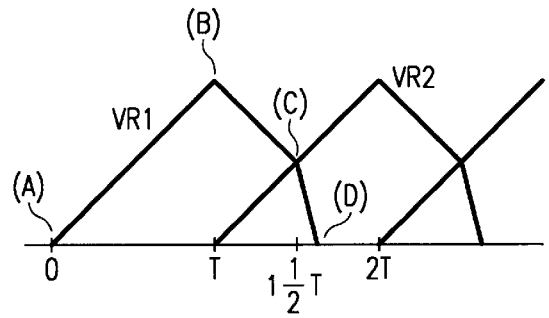
FIG. 5 shows a timing diagram of certain signals of the innovative circuit.
Figure 3:
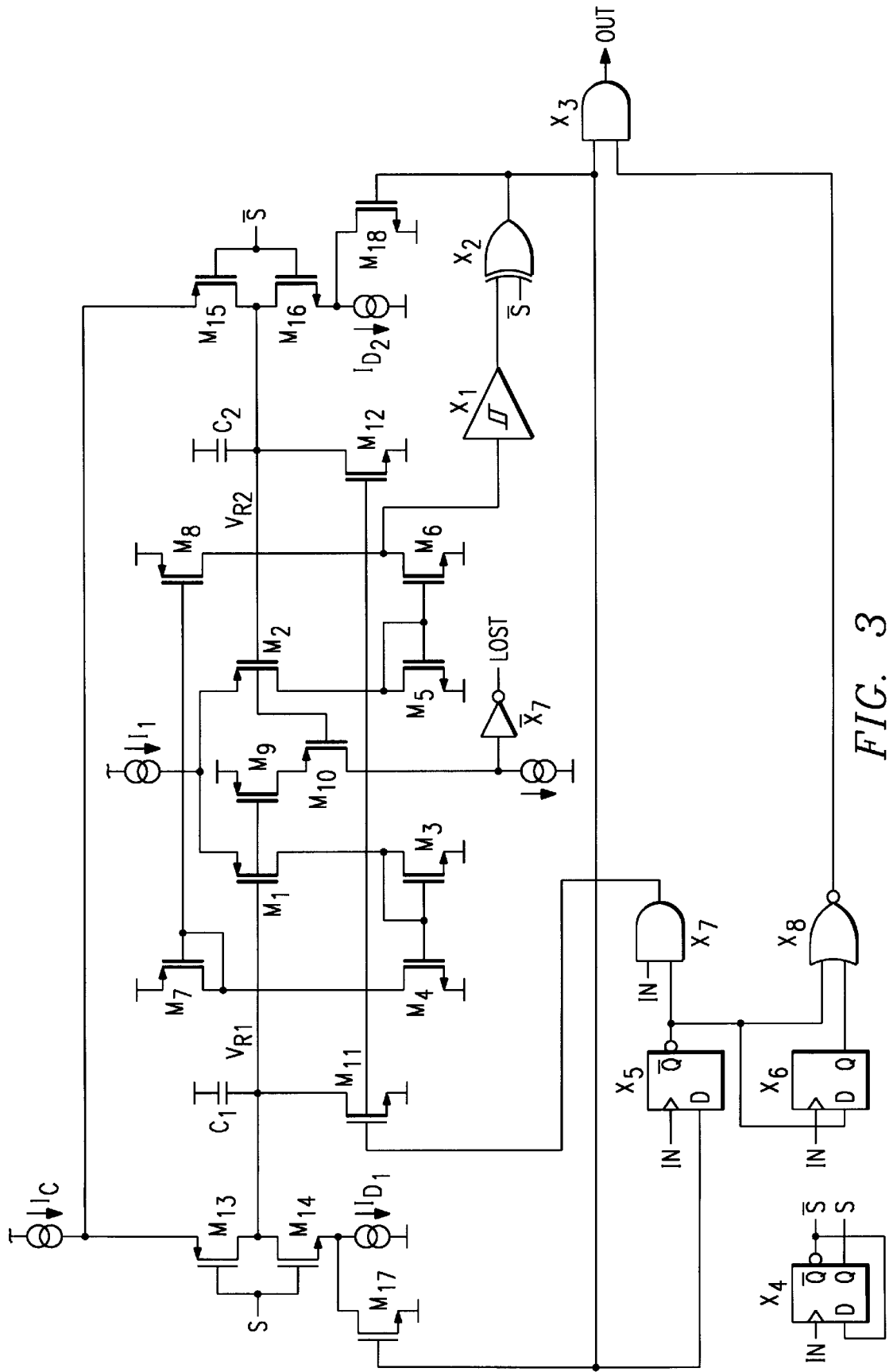
FIG. 3 shows a detailed phase-alignment circuit according to the preferred embodiment.

In the detailed diagram of the preferred embodiment, as shown in FIG. 3, a pair of capacitors C1 and C2 are used to generate two ramp waveforms VR1 and VR2, which are shown in FIG. 5. In this embodiment, we set C1=C2. A current source IC is used to charge the capacitors, and current sources ID1 and ID2 are used to discharge them. In the preferred embodiment, IC=ID1=ID2.

Circuit Startup

At startup, when time t=0, both VR1 and VR2 will equal zero. IC is connected to charge C1 for a time equal to one period T of the incoming signal. In the preferred embodiment, the incoming signal is the output of a crystal oscillator circuit, but alternate embodiments provide for virtually any periodic input signal.

At time t=T, VR1=IC·T/C1, and VR2=0.

At this time (t=T), IC is connected to charge C2 and ID1 is connected to discharge C1. In this embodiment, the slopes of the two voltage waveforms are equal in magnitude, but have opposite sign, so the two voltages VR1 and VR2 will equal one another at time t=3/2*T, or in other words the two voltages will equal one another one half-period after the transition at time (t=T). This point can be detected by a comparator to generate an output signal having the desired duty cycle of 50%. As soon as this transition is achieved, C1 is discharged to ground by a switch to reset it to zero. VR2 continues to charge until it reaches a voltage of VR2=IC*T/C2 at time t=2T; at this point, IC is switched to C1 and ID2 is switched to C2. The two ramp voltages will cross one another one half-period later. By swapping between the two capacitors, this process can be kept up indefinitely.

In this embodiment, M1/M2 are the input pair of a comparator which compares the ramp voltages VR1 and VR2 present across capacitors C1 and C2. The remainder of the comparator consists of transistors M3, M4, M5, M6, M7 and M8 and Schmitt trigger X1. The output of X1 is high when VR2<VR1.

Capacitors C1 and C2 are charged from current source IC and discharged by current sources ID1 and ID2 (which may be merged into one by the addition of a suitable switching network). IC=ID1=ID2. Charge/discharge currents IC, ID1, and ID2 are controlled by switches M13, M14, M15, and M16, which in turn are driven by phase latch X4. The outputs of X4 toggle once per period, so as to alternately charge and discharge capacitors C1 and C2.

If the voltage at the output of XOR gate X2 is low at the end of any period of signal IN, then the capacitor being discharged has not been fully reset and the circuit may not operate properly. A start-up circuit consisting of flip-flop X5, gate X7, and transistors M11 and M12 will ensure proper starting under all possible conditions. If the output of X2 is low at the end of a period of IN, the inverting output of X5 goes high. AND gate X7 generates a positive going pulse which turns on both M11 and M12 and resets both C1 and C2, thus restoring normal operations. The circuit may spontaneously begin to operate without this circuitry, but its addition will ensure deterministic startup in minimum time.

Flip-flop X6 is used to delay the output until the second cycle after a reset, corresponding to point B in FIG. 5. This ensures correct operation of the circuit, eliminating a potentially incorrect output during the first cycle of operation after a reset.

Transistors M9 and M10 detect if either capacitor charges to the rail, indicating that the input clock has halted. Invertor X7 thus provides an indication of the loss of the input signal. This feature can be used to engage an alternate oscillator circuit, which may be useful during the long startup time characteristic of low-power crystal oscillator circuits.

The paired charge-discharge oscillators generate linear ramp voltages, as shown FIG. 5. The preferred embodiment of the innovative circuit is used to produce ramp voltages VR1 and VR2. Both initially start from zero, at point A. VR1 then charges for one period T of the input signal, to reach point B.

Next, VR1 is discharged at the same rate of slew at which it was charged, and VR2 is simultaneously charged at this same slew rate. The two ramps will intercept each other at point C. The time elapsed from point B to point C is T/2.

Next, VR1 is discharged rapidly to ground to prepare for the next cycle of operation. Because VR1 is discharged quickly, it soon reaches zero within a very small percentage of error D, which would not necessarily occur if the ramp continued down with the previously determined slope. This technique eliminates the potential for the ramp waveforms to gradually rise off of ground because of incomplete capacitor discharge. It also ensures that the ramp waveforms start from a known and fixed voltage, thus minimizing errors in ramp height due to overshoot or undershoot.

The operation of the circuit then continues, with VR1 and VR2 swapping roles.

Figure 7:
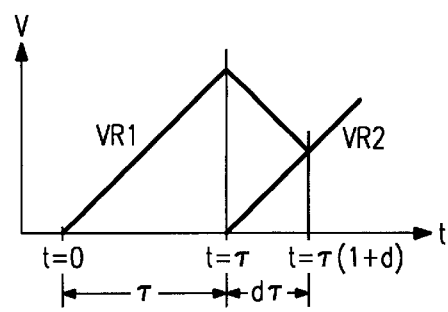
FIG. 7 shows a timing diagram of certain signals of the innovative circuit.

This innovative circuit provides significant advantages over the prior art, including (but not limited to):

The innovative circuit can produce duty cycles other than 50% by appropriately ratioing IC and ID. The relationship between the duty cycle d and the charge and discharge currents IC and ID can be determined from the basic capacitor equation CV=IT. Looking at FIG. 7, we see that voltage VR1 across capacitor C1 increases from time t=0 to time t=T as:

$$VR1 = IC \cdot T / C1$$

From time t=T to time t=T(1+d), voltage VR1 varies as:

$$VR1 = IC \cdot T / C1 - ID \cdot (t-T) / C1$$

and the voltage VR2 across capacitor C2 varies as:

$$VR2 = IC \cdot (t-T) / C2$$

If, at time t=T(1+d), VR1=VR2, then $$VR1 = IC \cdot T / C1 - ID \cdot dT / C1$$

$$VR2 = IC \cdot dT / C2$$

$$(IC \cdot T - dID \cdot T)/C1 = dIC \cdot T / C2$$

$$(IC - dID)/C1 = dIC/C2$$

Since C1=C2, $$IC - dID = dIC$$

$$d(IC + ID) = IC$$

$$d = IC/(IC + ID)$$

As this equation indicates, 0<d<1. In practice, the minimum duty cycle will be slightly greater than 0 and the maximum duty cycle will be slightly less than 1 due to switching delays and the time required to fully discharge the capacitors.

An additional function of the preferred embodiment allows the circuit to produce a signal which will indicate the loss of the clock which feeds it. This is useful because crystal oscillators are slow to start and therefore an auxiliary RC oscillator can be substituted until the crystal is up and running. Furthermore, more current can be diverted to the crystal to get it started. Similarly, this feature can be used to indicate that more current is needed to drive an RC oscillator during shutdown.

This function was previously implemented using separate, dedicated circuitry, which can be eliminated from the present phase alignment circuit because the present preferred embodiment can perform this function itself. To do so, it is simply necessary to determine if either ramp voltage exceeds a threshold voltage which would not be reached in time T; this indicates no input clock signal has arrived. This function is implemented using transistors M9 and M10 in combination with inverter X7. If the ramp on either capacitor C1 or C2 goes too high, signal LOST will indicate an error condition.

As described above, the aligner circuit is sensitive to one edge, e.g. the rising edge, of the incoming signal, and each capacitor is alternately charged for one full period of the incoming signal. The circuit may also easily be used as a clock doubler by making the innovative circuit sensitive to both the rising and falling edges of the input signal, by means known to one of ordinary skill in the art. This would force each capacitor to charge for one half-period of the input signal, and the resulting output would be a doubled clock signal with the selected duty cycle.

Alternate Embodiment: Aligner and Clock Multiplier

Figure 6:
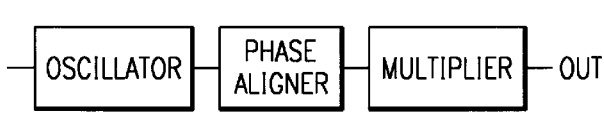
FIG. 6 shows a block diagram of an alternative embodiment of the present invention.

According to an alternative embodiment, it is also possible to connect two of the innovative circuits in series with the input signal, with one circuit connected to align the phase of the input signal, and the other circuit connected to multiply the frequency of the phase-aligned signal. A block diagram of such a circuit is shown in FIG. 6, in which an oscillator circuit is connected to a phase alignment circuit according to the preferred embodiment. This circuit is in turn connected to a second circuit according to the preferred embodiment, which is configured as a frequency multiplier.

Alternate Embodiment: Variable Duty Cycle

According to a further alternative embodiment, the values of the current sources to one or both of the capacitors may be varied to produce an output signal having a duty cycle more or less that 50%, as the target application requires. Typical applications of such a feature include charge pumps and some digital circuits.

According to a disclosed class of innovative embodiments, there is provided a phase-aligned oscillator system, comprising an oscillator stage connected to produce a first periodic signal; and a phase alignment stage connected to receive said first periodic signal, and connected to produce a second signal with a precisely defined duty cycle, said phase alignment stage being slaved to said oscillator stage.

According to another disclosed class of innovative embodiments, there is provided a phase-aligned crystal oscillator system, comprising an oscillator stage connected to produce a first AC signal; a phase alignment stage connected to receive said first AC signal, and connected to alternately charge and discharge each of a pair of capacitors at a first rate according to transitions in said AC signal, and connected to produce an output signal which varies according to the voltage across each of said pair of capacitors; and wherein when the voltage across each of said pair satisfies a predefined criteria, the rate of discharge of said discharging one of said pair of capacitors is increased.

According to another disclosed class of innovative embodiments, there is provided a phase-alignment circuit, comprising first, second, third, and fourth current sources; a first capacitor connected to be charged by said first current source at a first charge rate and discharged by said second current source according to an input signal; a second capacitor connected to be charged by said third current source at said third charge rate and discharged by said fourth current source; control logic connected to said current sources to charge said second capacitor and discharge said first capacitor according to transitions in said input signal, and to discharge said first capacitor at a second rate, which is faster than said first rate, after the voltage across said first capacitor has equalled the voltage across said second capacitor; an output stage connected to produce an output signal according to the voltage across said first and second capacitors; wherein said first and second capacitors are alternately charged and discharged according to said input signal.

According to another disclosed class of innovative embodiments, there is provided a method for stabilizing an input signal, comprising the steps of: (a) charging a first capacitor at a first rate; (b) detecting a transition of said input signal, and then discharging said first capacitor at said first rate and charging a second capacitor at said first rate; (c) detecting when the voltage across said first capacitor equals the voltage across said second capacitor, and thereafter discharging said first capacitor at a second rate which is faster than said first rate; (d) repeating steps (b)–(c), reversing said first and second capacitors; (e) comparing the voltage across said first and second capacitors and producing a corresponding stabilized output signal.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A phase-alignment circuit, comprising:

first, second, third, and fourth current sources;

a first capacitor connected to be charged by said first current source at a first charge rate and discharged by said second current source according to an input signal;

a second capacitor connected to be charged by said third current source at said third charge rate and discharged by said fourth current source;

control logic connected to said current sources to control charging of said second capacitor and discharging of said first capacitor according to transitions in said input signal, and to control discharging of said first capacitor at a second rate, which is faster than said first rate, after the voltage across said first capacitor has become equal to the voltage across said second capacitor;

an output stage connected to produce an output signal according to the voltages across said first and second capacitors;

wherein said first and second capacitors are alternately charged and discharged according to said input signal.

2. The circuit of claim 1, wherein said third charge rate is equal to said first charge rate.

3. The circuit of claim 1, wherein when the voltage across said first capacitor passes a first threshold, said control logic produces an error signal.

4. The circuit of claim 1, wherein said first and third current sources are a common current source, and said second and fourth current sources are a common current source.

5. A method for stabilizing an input signal, comprising the steps of:
   (a) charging a first capacitor at a first rate;
   (b) detecting a transition of said input signal, and then discharging said first capacitor at said first rate and charging a second capacitor at said first rate;
   (c) detecting when the voltage across said first capacitor equals the voltage across said second capacitor, and thereafter discharging said first capacitor at a second rate which is faster than said first rate;
   (d) repeating steps (b)–(c), reversing said first and second capacitors;
   (e) comparing the voltage across said first and second capacitors and producing a corresponding stabilized output signal.

6. A phase alignment circuit, comprising:
   a first capacitor connected to be charged or discharged by a first current source according to a first control signal;
   a second capacitor connected to be charged or discharged by a second current source according to a second control signal;
   control logic connected so as to receive an input signal and to receive the voltages across said first and second capacitors and connected so as to produce said first and second control signals and an output signal;
   wherein said control logic is operable to produce said output signal having a frequency equal to said input signal and a duty cycle determined by the ratios of charge and discharge rates of said first and second current sources.

7. The phase alignment circuit of claim 6, wherein said control logic is operable in a first mode to charge said first capacitor at a first charge rate for a first time interval determined by said input signal, and to discharge said second capacitor at a first discharge rate proportional to said first charge rate when the voltage across said second capacitor is greater than the voltage across said first capacitor, and to discharge said second capacitor at an increased rate when the voltage across said second capacitor drops below the voltage across said first capacitor;
   said control logic further operable in a second mode to charge said second capacitor at said first charge rate for a second time interval determined by said input signal, and to discharge said first capacitor at said first discharge rate when the voltage across said first capacitor is greater than the voltage across said second capacitor, and to discharge said first capacitor at an increased rate when the voltage across said first capacitor drops below the voltage across said second capacitor;
   wherein the duration of said second time interval is equal to the duration of said first time interval;
   wherein said first and second modes are successively repeated.

8. The phase alignment circuit of claim 7 wherein said control logic is operable to set said output signal to a first logic state whenever the voltage across said second capacitor is less than the voltage across said first capacitor during said first time interval, and whenever the voltage across said first capacitor is less than the voltage across said second capacitor during said second time interval;
   said control logic further operable to set said output signal to a second logic state whenever the voltage across said first capacitor is less than the voltage across said second capacitor during said first time interval, and whenever the voltage across said second capacitor is less than the voltage across said first capacitor during said second time interval.

9. The phase alignment circuit of claim 7, wherein the control logic is operated in said first mode when said input signal transitions from a first logic state to a second logic state, and operated in said second mode when said input signal transitions from said second logic state to said first logic state, such that said control login operates in both first and second modes during each period of said input signal.

10. The phase alignment circuit of claim 7 wherein said first and second capacitances have equal values.

11. The phase alignment circuit of claim 7 wherein said first discharge rate is equal in magnitude but opposite in polarity to said first charge rate.

12. The phase alignment circuit of claim 7, wherein said control logic is further operable such that if in any time interval both the voltage across said first capacitor and the voltage across said second capacitor exceed a threshold value, then said first and second current sources will discharge both said first and said second capacitors at a rate sufficient to ensure that both of said capacitors are fully discharged during said any time interval.

13. The phase alignment circuit of claim 12, wherein said control logic is operable to ensure said output signal remains in said first logic state during any time interval immediately succeeding a time interval in which the voltage across both said first and said second capacitors exceeded said threshold value.

14. The phase alignment circuit of claim 12, wherein said control logic is operable to ensure said output signal remains in said second logic state during any time interval immediately succeeding a time interval in which the voltage across both said first and said second capacitors exceeded said threshold value.

15. The phase alignment circuit of claim 6, wherein said first and second current sources consist of a first circuit operable to provide said first charge rate, a second circuit operable to provide said first and second discharge rate, and a network of switches connected so as to provide said first charge rate and said first and second discharge rates to said first and second capacitors according to said control logic.

16. Said phase alignment circuit of claim 15 wherein said switches are MOSFET transistors.

17. Said phase alignment circuit of claim 15 wherein said first and second circuits are comprised of current mirrors.

* * * * *